(12) United States Patent
Boldt et al.

(10) Patent No.: US 9,564,243 B2
(45) Date of Patent: Feb. 7, 2017

(54) EQUIVALENT FUSE CIRCUIT FOR A ONE-TIME PROGRAMMABLE READ-ONLY MEMORY ARRAY

(71) Applicant: GLOBALFOUNDRIES Singapore Pte. Ltd., Singapore (SG)

(72) Inventors: Juergen Boldt, Dresden (DE); Stephan Hay, Singapore (SG)

(73) Assignee: GLOBALFOUNDRIES SINGAPORE PTE. LTD., Singapore (SG)

(*) Notice: Subject to any disclaimer, the term of this patent is extended or adjusted under 35 U.S.C. 154(b) by 254 days.

(21) Appl. No.: 14/259,687

(22) Filed: Apr. 23, 2014

(65) Prior Publication Data
US 2015/0310930 A1 Oct. 29, 2015

(51) Int. Cl.
*G11C 17/18* (2006.01)
*G11C 17/16* (2006.01)
*G11C 29/56* (2006.01)
*G01R 31/07* (2006.01)
*G01R 31/02* (2006.01)
*G01R 31/327* (2006.01)
*G01R 31/00* (2006.01)
*G11C 29/50* (2006.01)

(52) U.S. Cl.
CPC ............. *G11C 17/18* (2013.01); *G11C 17/16* (2013.01); *G11C 29/56* (2013.01); *G01R 31/006* (2013.01); *G01R 31/025* (2013.01); *G01R 31/026* (2013.01); *G01R 31/07* (2013.01); *G01R 31/327* (2013.01); *G11C 2029/5006* (2013.01)

(58) Field of Classification Search
CPC ...... G01R 31/07; G01R 31/026; G01R 31/006; G01R 31/327; G01R 31/025; G11C 29/56; G11C 17/18; G11C 17/16; G11C 2029/5006
USPC ....................................................... 324/550
See application file for complete search history.

(56) References Cited

U.S. PATENT DOCUMENTS

| | | | | |
|---|---|---|---|---|
| 5,200,922 A | * | 4/1993 | Rao | G11C 16/08 365/185.04 |
| 5,331,196 A | * | 7/1994 | Lowrey | H01L 27/112 257/529 |
| 5,598,373 A | * | 1/1997 | Wada | G11C 29/02 365/185.09 |
| 6,462,998 B1 | * | 10/2002 | Proebsting | G11C 7/04 257/E21.659 |
| 6,992,945 B2 | * | 1/2006 | Otsuka | G11C 17/18 327/525 |

(Continued)

Primary Examiner — Jermele M Hollington
Assistant Examiner — Christopher McAndrew
(74) Attorney, Agent, or Firm — Lorenz & Kopf, LLP

(57) ABSTRACT

Technologies are provided for measuring a programming current (PC) for a memory cell (MC) of a one-time programmable read-only memory array. The MC includes a fuse equivalent circuit (FEC) that includes a first current path (CP) having a first node, a second CP having a fuse of the memory cell and a second node, and a third CP. The PC is split into a first current, a second current and a third current that flow over the first CP, the second CP, and the third CP, respectively. A first voltage applied along the first path is divided to generate a second voltage at the first node, and an output voltage generated by an operational amplifier controls the second current to maintain a third voltage at the second node at substantially the same value as the second voltage so that the second current has a sufficiently low value and does not burn the fuse.

9 Claims, 2 Drawing Sheets

(56) References Cited

U.S. PATENT DOCUMENTS

| | | | |
|---|---|---|---|
| 7,002,414 B2* | 2/2006 | Chang | H03K 23/667 |
| | | | 331/1 A |
| 7,724,600 B1* | 5/2010 | Im | G11C 17/18 |
| | | | 365/225.7 |
| 2004/0090273 A1* | 5/2004 | Chang | H03K 23/667 |
| | | | 331/16 |
| 2007/0095137 A1* | 5/2007 | Ku | G01D 5/145 |
| | | | 73/514.31 |
| 2007/0223704 A1* | 9/2007 | Brickell | G09C 1/00 |
| | | | 380/281 |
| 2008/0006902 A1* | 1/2008 | Chakravarti | H01L 23/5256 |
| | | | 257/529 |
| 2008/0012531 A1* | 1/2008 | Chang | H01M 10/4207 |
| | | | 320/134 |
| 2008/0117032 A1* | 5/2008 | Dillon | B60Q 1/503 |
| | | | 340/426.1 |
| 2013/0329498 A1* | 12/2013 | Villavelez | G11C 16/10 |
| | | | 365/185.15 |

* cited by examiner

EQUIVALENT FUSE CIRCUIT FOR A ONE-TIME PROGRAMMABLE READ-ONLY MEMORY ARRAY

TECHNICAL FIELD

Embodiments of the subject matter described herein relate generally to memory devices, and associated operating methods. More particularly, embodiments of the subject matter relate to an equivalent fuse circuit for a one-time programmable read-only memory array.

BACKGROUND

A one-time programmable read-only memory (OTPROM) array is a memory architecture that includes a plurality of memory cells that can each be programmed a single time. Each memory cell can store the equivalent of one bit (i.e., a logic high value or state, or a logic low value or state) and is commonly referred to as a bit cell. The terms memory cell and bit cell are used interchangeably herein.

Typically all memory cells of a OTPROM array are programmed during manufacturing such that all bits read a logical one (1). After manufacturing each memory cell of the OTPROM array can be programmed one time. To allow the memory cell to be programmed, each memory cell includes a fuse that can be "burned" to program the memory cell. Here, the term "burn" is used to refer to the process of programming a memory cell and more particularly to the process of "burning" a fuse of the memory cell to cause that memory cell to read a logical zero (0). Once a memory cell has been programmed, it is not possible to program it again since the fuse cannot be unburned.

In order to determine the current required to burn the fuses of the OTPROM array, one memory cell of the OTPROM array can be selected and tested. A current meter can be used to measure a programming current (Iprog) that can be used to program the memory cells of the OTPROM array.

FIG. 1 shows a programming path for a particular memory cell of an OTPROM array (not illustrated in FIG. 1) that is selected and used during testing to measure a programming current (Iprog) that can be used program the memory cells of the OTPROM array. FIG. 1 also illustrates a bit line driver 110 for the memory cell 150 and other external elements 170, 180 that are not part of the OTPROM array, but that are used during testing of the array to measure the programming current (Iprog) 172. As illustrated in FIG. 1, a programming voltage source (Vprog) 180 is coupled to the bit line driver 110 for memory cell 150. During testing, this particular memory cell 150 of the array can be selected so that it is coupled to a programming voltage source (Vprog) 180. Thus, the memory cell 150 is one memory cell of an OTPROM array that is selected during testing for measuring a programming current (Iprog) 172 via current meter 170. In this regard, it is noted that the memory cell 150 can be any memory cell in the OTPROM array, and that any other memory cell (not illustrated) of the OTPROM array could be selected and used to measure a programming current (Iprog) 172.

The memory cell includes an N-channel transistor 130 and fuse 120 having a resistance (Rpre). Each memory cell is coupled to a bit line 132 and a word line 134 that are used to select that memory cell 150. When the p-channel transistor 110 (that is used to implement the bit line driver) is turned on by applying an appropriate voltage at its gate and the N-channel transistor 130 of the memory cell 150 is turned on by applying an appropriate voltage at its gate, a programming current (Iprog) 172 is allowed to flow through node B and the memory cell 150 to ground 190. This programming current (Iprog) 172 can be measured via the current meter 170.

A problem with this arrangement is that the programming current (Iprog) 172 that flows through the fuse 120 and will eventually cause the fuse 120 to burn, which is undesirable since the memory cell 150 is no longer useful because it can no longer be programmed. It would be desirable to provide a solution that avoids burning of the fuse 120 during measurement of the programming current (Iprog) 172.

One approach for preventing the fuse 120 from burning is to use a fuse array. FIG. 2 illustrates a conventional fuse array 200 that can replace the fuse 120 of FIG. 1. The fuse array 200 is a 10×10 array of the fuses 120-1 . . . 120-100. The values of the fuses 120-1 . . . 120-100 are selected such that the fuse array 200 has the same resistance value (Rpre) as the fuse 120 of FIG. 1. The fuse array 200 provides one possible solution to the problem of unwanted burning because as the programming current (Iprog) 172 flows through the array 200 it splits over ten different paths. As such, only ¹/₁₀th of the programming current (Iprog) 172 flows through each of the fuses 120-1 . . . 120-100 and the fuses 120-1 . . . 120-100 do not burn. However, this approach is has drawbacks.

For example, employing 100 fuses 120-1 . . . 120-100 instead of one fuse 120 consumes a much larger area. Another problem is that the wiring to connect 100 fuses causes unwanted parasitic resistors that reduce measurement accuracy. This is particularly true when the fuses 120-1 . . . 120-100 each have low resistance values (e.g., 30 ohms) Although none of the fuses 120-1 . . . 120-100 burn when using this approach, it would be desirable to provide an alternative approach to the one illustrated in FIG. 2 that does not suffer from the drawbacks mentioned above, and is not prone to measurement errors (e.g., reduced measurement accuracy particularly in case of metal fuses with low Rpre values (e.g. 30 ohms))

Another approach for preventing the fuse 120 from burning is to replace the fuse 120 with a variable resistor having a resistance value that is close to the measured resistance value (Rpre) of the fuse 120. However, this approach can be difficult to implement since the accuracy of the variable resistor is difficult to control due to process variations, non-linearities, temperature effects, etc. Differences between the resistance value of the variable resistor and the resistance value (Rpre) of the fuse 120 can result in additional errors when measuring the programming current (Iprog) 172.

Accordingly, it is desirable to provide improved techniques and technologies that can be used to measure a programming current for programming a memory cell of a one-time programmable read-only memory array without causing unwanted burning of the fuse associated with the selected memory cell. Furthermore, other desirable features and characteristics of the present invention will become apparent from the subsequent detailed description of the invention and the appended claims, taken in conjunction with the accompanying drawings and this background of the invention The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

BRIEF SUMMARY OF EMBODIMENTS

In accordance with some of the disclosed embodiments, method is provided for measuring a programming current for programming a memory cell of a one-time programmable read-only memory array. The programming current is input to a fuse equivalent circuit that includes a first current path, a second current path that includes a fuse of the memory cell, and a third current path. The programming current splits into a first current that flows over the first current path, a second current that flows over the second current path, and a third current that flows over the third current path. A first voltage applied along the first path is divided to generate a second voltage at a first node located along the first path. An output voltage is generated that controls the second current to maintain a third voltage at a second node along the second path at substantially the same value as the second voltage so that the second current has a sufficiently low value and the fuse does not burn when the second current flows through the fuse.

In accordance with some of the disclosed embodiments, a one-time programmable read-only memory array is provided that includes a memory cell comprising a first transistor and a fuse equivalent circuit. The fuse equivalent circuit is configured to receive a programming current, and configured to output the programming current to the first transistor. The fuse equivalent circuit includes a voltage divider, an operational amplifier, a current mirror and a fuse coupled to the first transistor and the voltage divider. The voltage divider is configured to divide a first voltage to generate a second voltage. The operational amplifier includes a first input configured to receive a third voltage, and an output that is configured to generate an output voltage. The current mirror is configured to receive the output voltage and configured to generate a first current that is received by the fuse. The output voltage generated by the operational amplifier controls the first current to maintain the third voltage at substantially the same value as the second voltage.

In accordance with some of the disclosed embodiments, a system is provided for testing a one-time programmable read-only memory array. The system comprises a programming voltage source that is configured to generate a programming current, a current meter that is configured to measure the programming current, and a bit line driver. The one-time programmable read only memory array includes a bit line coupled to the bit line driver, a word line, and a memory cell coupled to the bit line driver. The memory cell comprises a first transistor coupled to the word line, and a fuse equivalent circuit configured to receive the programming current and to output the programming current to the first transistor. The fuse equivalent circuit includes a voltage divider, an operational amplifier, a current mirror and a fuse coupled to the first transistor and the voltage divider. The voltage divider is configured to divide a first voltage to generate a second voltage. A first current flows through the voltage divider. The operational amplifier includes a first input configured to receive a third voltage, a second input coupled to the voltage divider, and an output that is configured to generate an output voltage. The current mirror is coupled to the bit line driver, the voltage divider and the output of the operational amplifier. The current mirror is configured to receive the output voltage and configured to generate a second current that is received by the fuse. The fuse is coupled to the first transistor and to the voltage divider. The output voltage generated by the operational amplifier controls the second current to maintain the third voltage at substantially the same value as the second voltage.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

For the sake of brevity, conventional techniques related to transistor design and manufacturing, the control of memory devices, memory cell programming, and other functional aspects of the devices and systems (and the individual operating components of the devices and systems) may not be described in detail herein. Furthermore, the connecting lines shown in the various figures contained herein are intended to represent example functional relationships and/or physical couplings between the various elements. It should be noted that many alternative or additional functional relationships or physical connections may be present in an embodiment.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The following description refers to elements or nodes or features being "connected" or "coupled" together. As used herein, unless expressly stated otherwise, "coupled" means that one element/node/feature is directly or indirectly joined to (or directly or indirectly communicates with) another element/node/feature, and not necessarily mechanically. Likewise, unless expressly stated otherwise, "connected" means that one element/node/feature is directly joined to (or directly communicates with) another element/node/feature, and not necessarily mechanically. In addition, certain terminology may also be used in the following description for the purpose of reference only, and thus are not intended to be limiting. For example, terms such as "first," "second," and other such numerical terms referring to elements or features do not imply a sequence or order unless clearly indicated by the context.

Figure 1:
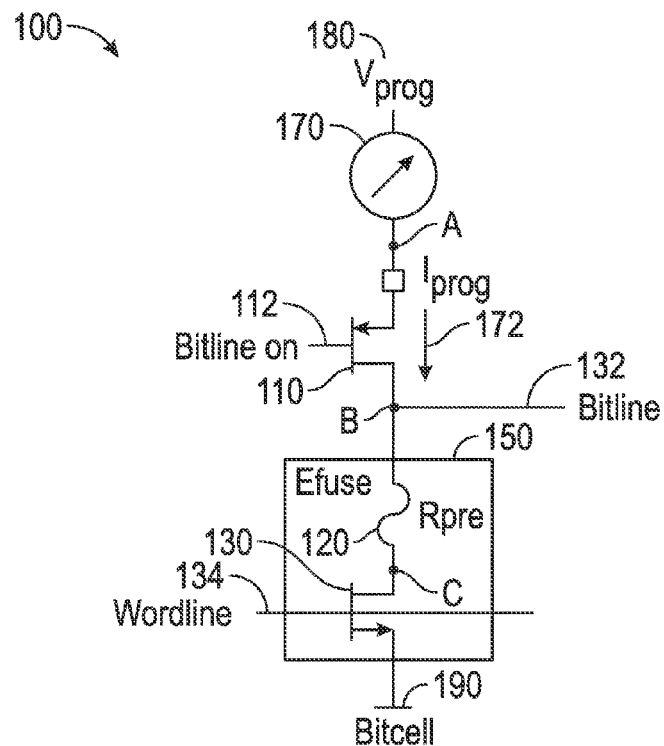
FIG. 1 shows a programming path for a particular memory cell of one-time programmable read-only memory (OTPROM) array that is used measure a programming current for programming memory cells of the OTPROM array.
Figure 2:
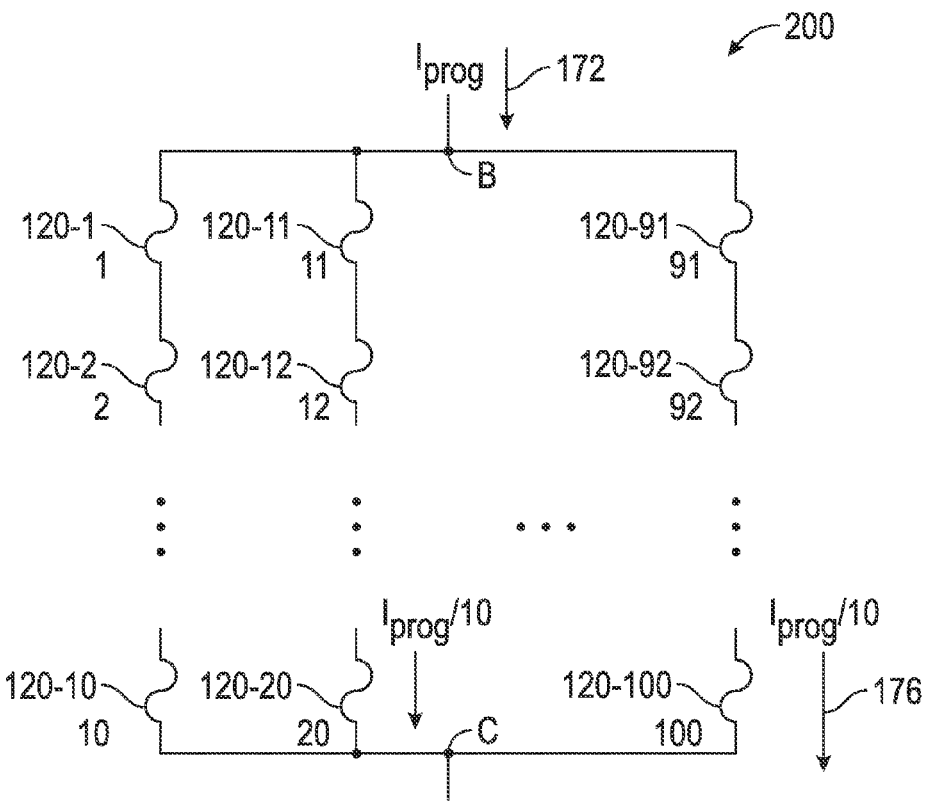
FIG. 2 illustrates a conventional fuse array that can replace the fuse of FIG. 1.
Figure 3:
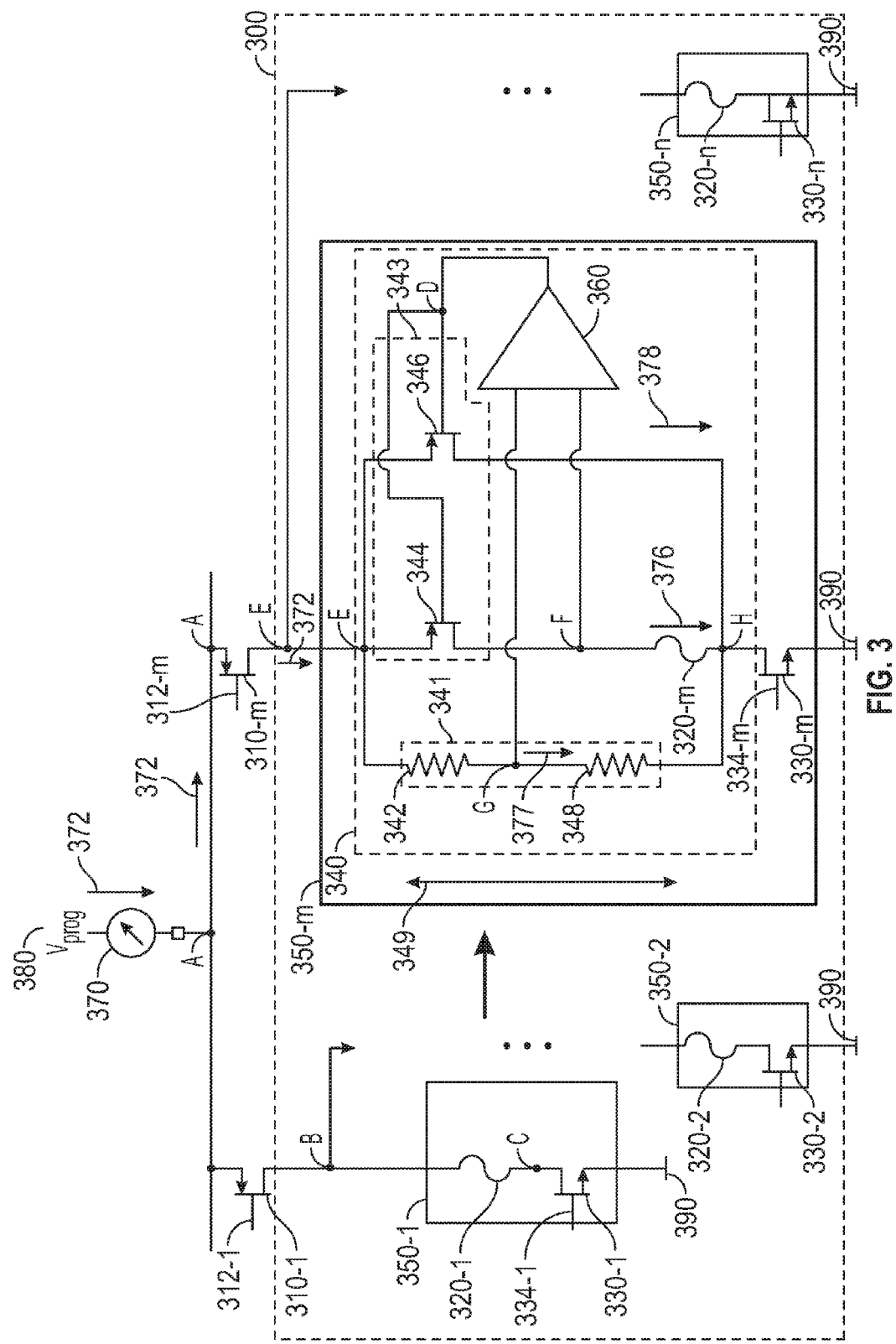
FIG. 3 is a block diagram that illustrates a one-time programmable read-only memory (OTPROM) array that includes a fuse equivalent circuit in accordance with some of the disclosed embodiments.

FIG. 3 is a block diagram that illustrates a one-time programmable read-only memory (OTPROM) array 300 that includes a fuse equivalent circuit 340 in accordance with some of the disclosed embodiments. FIG. 3 also shows external elements that are not part of the array 300 including bit line drivers 310-1 . . . 310-m that are each implemented using a p-channel transistor 310 that are used to drive bits lines of each memory cell 350-1 . . . 350-m, as well as a current meter 370 and a programming voltage source 380 that are used during testing of the array 300. In addition, various nodes A-H are labeled on FIG. 3 for reference purposes.

The one-time programmable read only memory array 300 includes bit lines 312-1 . . . 312-m, word lines 334-1 . . . 334-n, and a corresponding number of memory cells 350-1 . . . 350-m. Due to space constraints, only four the memory cells 350-1, 350-2, 350-n, 350-m are illustrated in FIG. 3; however, those skilled in the art will appreciate that a typical array 300 include a large number (e.g., 4096 cells, 8192 cells, . . . , etc.) of memory cells. As such, the array 300 may also include a number of additional memory cells 350-3 through 350-m-1 that are not illustrated due to space constraints.

In a typical one-time programmable read only memory array 300, each of the memory cells 350-1 . . . 350-m includes a fuse 320 and an N-channel transistor 330. For example, memory cell 350-1 includes a fuse 320-1 and an N-channel transistor 330-1. As will be explained below, in accordance with the disclosed embodiments, the fuse of one of the memory cells is replaced with a fuse equivalent circuit 340 that can prevent unwanted burning of the fuse 320-m during the measurement of the programming current (Iprog) 372 for programming the memory cells of the array 300.

A programming voltage source 380 generates a programming current (Iprog) 372 that can be measured by current meter 370. When testing is to being, a particular one of the memory cells 350-m is selected/activated by applying an appropriate voltage to a bit line that is coupled to gate 312-m (to turn on p-channel transistor 310-m) and by applying an appropriate voltage to a wordline that is coupled to the gate 334-m of N-channel transistor 330-m (to turn on the N-channel transistor 330-m). This activates the programming path and allows the programming current (Iprog) 372 to flow through the p-channel transistor 310-1 and the memory cell 350-m to ground 390.

In accordance with the disclosed embodiments, fuse 320-m of memory cell 350-m is replaced with a fuse equivalent circuit 340. The fuse equivalent circuit 340 is a two-terminal network that has the same impedance as an unburned fuse of memory cell in the array (e.g., unburned fuse 320-1 of memory cell 350-1, unburned fuse 320-2 of memory cell 350-2, unburned fuse 320-n of memory cell 350-n, etc.), but that can prevent fuse 320-m from being burned during testing. Thus, although the fuse equivalent circuit 340 has the same impedance as an unburned fuse, the fuse equivalent circuit 340 can prevent the fuse 320-m from being burned during testing.

Fuse Equivalent Circuit

In the particular embodiment illustrated in FIG. 3, the fuse equivalent circuit 340 includes: a voltage divider 341 that includes resistors 342, 348, a current mirror 343 that includes transistors 344, 346, an operational amplifier 360 and a fuse 320-m.

The voltage divider 341 is coupled to the bit line driver 310-m and the current mirror 343 (at node E), to the inverting input of the operational amplifier 360 (at node G), and to the memory cell 350-m (at node H). The voltage divider 341 includes a resistor (R0) 348 that is coupled between nodes G and H, and a resistor (R1) 342 that is coupled between nodes G and E. The voltage drop across the fuse equivalent circuit 340 between nodes E and H is the voltage (Veec) 349. The voltage divider 341 divides the voltage (Veec) 349 across the fuse equivalent circuit 340 among the resistors 342, 348 such that the voltage (Vr) at node G can be expressed in equation (1) as follows:

$$Vr = Veec*(R0/R0+R1) \qquad (1)$$

In one non-limiting exemplary implementation, resistor (R1) 342 has a resistance value that is nine times a resistance value of resistor (R0) 348. Because the resistance value of resistor (R1) 342 is nine times the resistance value of resistor (R0) 348, the voltage (Vr) will be $1/10^{th}$ of the voltage (Veec) 349.

It is noted that the resistance values of the resistors 342, 348 that are used to implement the voltage divider 341 are selected such that such that the voltage divider 341 has a relatively high impedance so that the first current (Ir) 377 that flows through the voltage divider 341 will be negligible compared to the sum of the second current (I1) 376 and the third current (I2) 378. In one exemplary implementation the total impedance of the voltage divider can be between 20 kΩ to 60 kΩ.

For instance, in one exemplary implementation, if the voltage (Veec) 349 is 1.0 Volts and Rpre is 30Ω, the resistance value of resistor (R1) 342 can be 27 kΩ and the resistance value of resistor (R0) 348 can be 3 kΩ, which would result in the voltage (Vr) at node G being 0.1 V, the first current (Ir) 377 that flows through the voltage divider 341 would be 33.3 μA, which is negligible compared to the sum of the second current (I1) 376 (3.3 mA) and the third current (I2) 378 (33.3 mA). It will be appreciated that this is merely one example. For instance, in an implementation where increased layout area is acceptable, the resistance value of resistor (R1) 342 could be 54 kΩ and the resistance value of resistor (R0) 348 could be 6 kΩ.

The operational amplifier 360 includes an inverting input coupled to node G, an non-inverting input coupled to node F, and an output coupled to node D. The voltage (Vr) at node G is applied to the inverting input and the voltage (Vf) at node F is applied at the non-inverting input. The operational amplifier 360 generates an output voltage (Vg) (at node G) that is an amplified version of the potential difference between the voltage (Vr) at the inverting input and the voltage (Vf) at the non-inverting input. Stated differently, the output voltage (Vg) generated by the operational amplifier 360 is the product of the differential input voltage (Vr−Vf) and the open loop gain (A) of the operational amplifier 360. The input voltages are substantially the same (e.g., Vf−Vr<1 mV). The output voltage (Vg) is applied to the gates of the first P-channel MOSFET 344 and the second P-channel MOSFET 346 of the current mirror 343. The operational amplifier 360 has a high open loop gain (e.g., 60 dB or more) and amplifies the difference between the input voltages to generate the output voltage (Vg) that controls the second current (I1) 376 that is output at the drain of the first P-channel MOSFET (TP1) 344. The voltage (Vr) serves as a reference/target voltage for the feedback loop (operational amplifier 360 and current mirror 343). The operational amplifier 360 compares the voltage (Vr) to the voltage (Vf) at node F and controls the current (I1) 376 via first P-channel MOSFET (TP1) 344 so that (Vf) is equal to voltage (Vr). Stated differently, the output voltage (Vg) generated by the operational amplifier 360 controls the first current (I1) 376 to maintain the voltage (Vf) at substantially the same value as the voltage (Vr) (e.g., a few millivolts or less). This causes a portion of the programming current (Iprog) 372 to flow through the fuse 320-m.

As the programming current (Iprog) 372 flows into node E, the operational amplifier 360 is part of a feedback loop that continuously controls the second current (I1) 376 via the output voltage (Vg) that is applied at the gates of the first P-channel MOSFET (TP1) 344 and the second P-channel MOSFET (TP2) 346 to ensure that the voltage (Vf) at node F will have the same value as the voltage (Vr) at node G.

The current mirror 343 is coupled between the output of the operational amplifier 360 (at node D), the bit line driver 310-m (at node E), and the fuse 320-m (at node F). The current mirror 343 includes a first P-channel MOSFET 344 and a second P-channel MOSFET 346. The first P-channel MOSFET 344 has a first gate having a first width-to-length value and generates the first current (I1) 376, whereas the second P-channel MOSFET 346 has a second gate having a second width-to-length value and generates the second current (I2) 378. The gate width-to-length ratio of the second P-channel MOSFET 346 to the first P-channel MOSFET 344 can also be referred to as a current gain ratio of the current mirror 343.

In one non-limiting exemplary implementation, the "second" gate width-to-length value of the second P-channel MOSFET 346 is nine times the "first" gate width-to-length value of the first P-channel MOSFET 344 such that the gate width-to-length ratio (or current gain ratio) of the second P-channel MOSFET 346 and the first P-channel MOSFET 344 is 9 to 1. For instance, if the second P-channel MOSFET 346 has a gate width of 81 μm and a gate length of 70 nm (i.e., a gate width-to-length value of 81 μm/70 nm), and the first P-channel MOSFET 344 has a gate width of 9 μm and a gate length of 70 nm (i.e., a gate width-to-length value of 9 μm/70 nm), then the second P-channel MOSFET 346 will have a gate width-to-length value that is nine times the gate width-to-length value of the first P-channel MOSFET 344 such that the gate width-to-length ratio of the second P-channel MOSFET 346 to the first P-channel MOSFET 344 is 9 to 1.

The programming current (Iprog) 372 that flows into node E and through the equivalent fuse circuit 340 will split along three paths into a first current (Ir) 377, a second current (I1) 376, and a third current (I2) 378. This can be expressed mathematically in equation (2) as follows:

$$Iprog = I1 + I2 + Ir \quad (2)$$

The second current (I1) 376 will have a value equal to the voltage (Veec) 349 divided by the product of 10 and the resistance value (Rpre) of the fuse 320-m. The second current (I1) 376 can be expressed mathematically in equation (3) as follows:

$$I1 = Veec/(10*Rpre) \quad (3)$$

In this particular example, because the gate width-to-length ratio of the transistors 344, 346 of the current mirror 343 is 1 to 9, the second current (I1) 376 output by first P-channel MOSFET 344 that flows through fuse 320-m will have a value of 1/10th of the programming current (Iprog) 372, whereas the third current (I2) 378 that is output by second P-channel MOSFET 346 will have a value of 9/10 of the programming current (Iprog) 372. The third current (I2) 378 can be expressed mathematically in equation (4) as follows:

$$I2 = 9*I1 \quad (4)$$

Thus, in this implementation, the third current (I2) 378 that is output at the drain of the second P-channel MOSFET 346 is nine times the value of the second current (I1) 376 that is output at the drain of the first P-channel MOSFET 344. As a result, the second current (I1) 376 that flows through the fuse 320-m has a sufficiently low value such that the fuse 320-m does not burn during testing, and the full programming current (Iprog) 372 still flows into node H through N-channel transistor 330-m and then to ground 395.

As noted above, the resistance values of the resistors 342, 348 that are used to implement the voltage divider 341 are selected such that the voltage divider 341 has a high impedance (e.g., 30 kΩ). As a result, the first current (Ir) 377 that flows through the voltage divider 341 will be sufficiently small (e.g., negligible compared to the sum of the second current (I1) 376 and the third current (I2) 378). As such, the programming current (Iprog) 372 can be expressed mathematically in expression (5) as follows:

$$Iprog \approx Veec/(10*Rpre) + Veec*9/(10*Rpre) \approx Veec/Rpre \quad (5),$$

where Rpre is the impedance of an unburned fuse 320-1. Equation (5) can be re-written in expression (6) as follows:

$$Rpre \approx Veec/Iprog \quad (6),$$

which means that the impedance of the fuse equivalent circuit 340 is substantially the same as the impedance (Rpre) of the unburned fuse (e.g., fuse 320-1) and therefore will deliver the same programming current (Iprog) 372 to N-channel transistor 330-m as would be received by other N-channel transistors 330 in the array 300 that include an unburned fuses 320. In this context, "substantially the same" means that the impedance between nodes E and H is nearly identical to the impedance (Rpre) of an unburned fuse (e.g., fuse 320-1) of the array 300.

In the preceding description of FIG. 3, an example implementation is described where the goal was to have 1/10th of the programming current (Iprog) 372 flow through the fuse 320-m, and to have 9/10ths of the programming current (Iprog) 372 flow from the second P-channel MOSFET 346 to node H. This implementation is non-limiting and is merely provided to illustrate one practical implementation.

Thus, although the description of FIG. 3 describes particular resistance ratios (1:9) for resistors 348, 342 used to implement the voltage divider 341, particular gate width-to-length ratios (1:9) of the transistors 344, 346 used to implement the current mirror 343, and particular ratios of the second current (I1) 376 and third current (I2) 378 (one-tenth of the programming current (Iprog) 372 to nine-tenths of the programming current (Iprog) 372, respectively), these ratios are associated with one non-limiting implementation that is exemplary only and should not to be construed as limiting. To the contrary, different ratios of the resistance values of resistors 342 and 348, and different gate width-to-length ratios of the gate width-to-length values of the transistors 346, 344 can selected in other implementations, and as a result, the ratios of the second current (I1) 376 and third current (I2) 378 would change accordingly so long as the second current (I1) 376 that flows through the fuse 320-m is limited to a value that does not cause the fuse 320-m to burn during testing. For example, in accordance with some of the disclosed embodiments, the ratios of the resistance values of resistors 342 and 348, and the gate width-to-length ratios of the gate width-to-length values of the transistors 346, 344 can be between 9:1 and 19:1. In this regard, it is noted that as these ratios increase, the second current (I1) 376 that flows through the fuse 320-m will decrease (and the voltage drop across the fuse 320-m will be lower), but that it will be more difficult for the operational amplifier 360 to handle smaller voltage differences between the voltage (Vr) and the voltage (Vf). On the other hand, as these ratios decrease, the second current (I1) 376 that flows through the fuse 320-m will increase (and the voltage drop across the fuse 320-m will be higher), which increases the likelihood of soft burning of the fuse 320-m. Ratios between 9:1 and 19:1 , ensure that the second current (I1) 376 that flows through the fuse 320-m will not cause the fuse 320-m to burn during testing, and will still allow the operational amplifier 360 to handle smaller voltage differences between the voltage (Vr) and the voltage (Vf).

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A one-time programmable read-only memory array, comprising:
    a memory cell, comprising:
        a first transistor; and
        a fuse equivalent circuit configured to receive a programming current and configured to output the programming current to the first transistor, the fuse equivalent circuit comprising:
            a voltage divider configured to divide a first voltage to generate a second voltage;
            an operational amplifier comprising: a first input configured to receive a third voltage, a second input coupled to the voltage divider and being configured to receive the second voltage, and an output that is configured to generate an output voltage;
            a current mirror configured to receive the output voltage and configured to generate a first current; and
            a fuse coupled to the first transistor at a node and the voltage divider at the node, the fuse being configured to receive the first current from the current mirror, wherein the output voltage generated by the operational amplifier controls the first current to maintain the third voltage at substantially the same value as the second voltage.

2. A one-time programmable read-only memory array according to claim 1, wherein the first current generated by the current mirror has a sufficiently low value such that the fuse does not burn when the first current flows through the fuse.

3. A one-time programmable read-only memory array according to claim 1, wherein the node is a first node, and wherein the current mirror and the fuse are coupled to a second node that is coupled to the first input of the operational amplifier, and wherein the voltage divider is coupled to the current mirror.

4. A one-time programmable read-only memory array according to claim 3, wherein the voltage divider comprises:
    a first resistor coupled to a second resistor at the first node, wherein the voltage divider divides the first voltage to generate the second voltage at the first node that is less than the first voltage, wherein a first resistance value of the first resistor is greater than a second resistance value of the second resistor.

5. A one-time programmable read-only memory array according to claim 1, wherein the current mirror receives the output voltage generated by the output of the operational amplifier and generates the first current, and wherein the current mirror comprises:
    a first P-channel MOSFET comprising a first gate having a first width-to-length value, and being configured to generate the first current; and
    a second P-channel MOSFET comprising a second gate having a second width-to-length value, and being configured to generate a second current,
    wherein the output voltage generated by the operational amplifier is applied to the first and second gates of the first P-channel MOSFET and the second P-channel MOSFET to control the first current generated by the first P-channel MOSFET to maintain the third voltage at substantially the same value as the second voltage.

6. A one-time programmable read-only memory array according to claim 5, wherein a ratio of the first current to the second current is determined based on a ratio of the first gate width-to-length value of the first P-channel MOSFET to the second gate width-to-length value of the second P-channel MOSFET.

7. A one-time programmable read-only memory array according to claim 6, wherein the first current generated by the first P-channel MOSFET is substantially less than the second current generated by the second P-channel MOSFET such that the first current that flows through the fuse is sufficiently small enough to prevent the fuse from burning.

8. A one-time programmable read-only memory array according to claim 6, wherein the second gate width-to-length value of the second P-channel MOSFET is greater than the first gate width-to-length value of the first P-channel MOSFET.

9. A one-time programmable read-only memory array according to claim 1, further comprising:
    a second memory cell comprising an unburned fuse having an impedance, wherein an impedance of the fuse equivalent circuit is the substantially same as the impedance of the unburned fuse.

* * * * *